United States Patent
Kessels et al.

(10) Patent No.: US 11,901,466 B2
(45) Date of Patent: Feb. 13, 2024

(54) PHOTOVOLTAIC CELL AND A METHOD FOR MANUFACTURING THE SAME

(71) Applicant: TECHNISCHE UNIVERSITEIT EINDHOVEN, Eindhoven (NL)

(72) Inventors: Wilhelmus Mathijs Marie Kessels, Tilburg (NL); Lachlan Edward Black, Waalre (NL)

(73) Assignee: TECHNISCHE UNIVERSITEIT EINDHOVEN, Eindhoven (NL)

( * ) Notice: Subject to any disclaimer, the term of this patent is extended or adjusted under 35 U.S.C. 154(b) by 29 days.

(21) Appl. No.: 16/979,472

(22) PCT Filed: Mar. 11, 2019

(86) PCT No.: PCT/NL2019/050158
§ 371 (c)(1),
(2) Date: Sep. 9, 2020

(87) PCT Pub. No.: WO2019/172770
PCT Pub. Date: Sep. 12, 2019

(65) Prior Publication Data
US 2021/0043784 A1 Feb. 11, 2021

(30) Foreign Application Priority Data
Mar. 9, 2018 (NL) ..................................... 2020560

(51) Int. Cl.
*H01L 31/00* (2006.01)
*H01L 31/0216* (2014.01)
*H01L 31/18* (2006.01)

(52) U.S. Cl.
CPC .... *H01L 31/02167* (2013.01); *H01L 31/1868* (2013.01)

(58) Field of Classification Search
CPC .................. H01L 31/02167; H01L 31/1868
See application file for complete search history.

(56) References Cited

U.S. PATENT DOCUMENTS

2013/0186460 A1 7/2013 Chen et al.
2013/0186464 A1* 7/2013 Sheng ............... H01L 31/02168
438/57

(Continued)

FOREIGN PATENT DOCUMENTS

TW I639241 B 10/2018
TW 201906180 A 2/2019

(Continued)

OTHER PUBLICATIONS

Tiitta et al., "Preparation and characterization of phosphorous-doped aluminum oxide thin films", Materials Research Bulletin, vol. 33, No. 9, pp. 1315-1323, 1998. (Year: 1998).*

(Continued)

*Primary Examiner* — Thanh Truc Trinh
(74) *Attorney, Agent, or Firm* — Birch, Stewart, Kolasch & Birch, LLP

(57) ABSTRACT

A photovoltaic cell includes a silicon substrate having two opposite main surfaces. A first main surface of the two main surfaces is covered with a passivation layer stack, including a $PO_x$- and Al-including-layer covering the first main surface, and a capping layer which covers the $PO_x$- and Al-including-layer. A method for manufacturing a photovoltaic cell is also disclosed.

22 Claims, 11 Drawing Sheets

(56) References Cited

U.S. PATENT DOCUMENTS

| | | | |
|---|---|---|---|
| 2013/0213469 A1* | 8/2013 | Kramer | H01L 31/022458 438/98 |
| 2013/0330936 A1* | 12/2013 | Lachaud | H01L 21/022 438/787 |
| 2014/0065764 A1 | 3/2014 | Scardera et al. | |
| 2014/0224313 A1 | 8/2014 | Wu et al. | |
| 2015/0101662 A1* | 4/2015 | Seutter | H01L 31/02167 136/256 |
| 2015/0162487 A1 | 6/2015 | Deshazer et al. | |

FOREIGN PATENT DOCUMENTS

| | | |
|---|---|---|
| WO | WO 2011/142666 A1 | 11/2011 |
| WO | WO 2013/151430 A1 | 10/2013 |
| WO | WO 2016/022026 A1 | 2/2016 |

OTHER PUBLICATIONS

International Search Report (PCT/ISA/210) issued in PCT/NL2019/050158, dated Jul. 12, 2019.
Written Opinion (PCT/ISA/237) issued in PCT/NL2019/050158, dated Jul. 12, 2019.
English translation of the Taiwanese Search Report for corresponding Taiwanese Application No. 108132189, dated Sep. 28, 2023.

* cited by examiner

PHOTOVOLTAIC CELL AND A METHOD FOR MANUFACTURING THE SAME

FIELD

The invention relates to a photovoltaic cell and to a method for manufacturing a photovoltaic cell.

BACKGROUND

Photovoltaic cells with passivation layers are known from e.g. WO2016022026A1.

SUMMARY

A limiting factor in the performance of silicon based photovoltaic cells, also called solar cells hereafter, is recombination of charge carriers at the surface, due to the presence of surface states which facilitate this recombination. Such surface recombination is an issue for solar cells, since charge carriers which recombine at the surface are lost and cannot contribute to the collected current, thereby reducing energy conversion efficiency. In order to reduce surface recombination, the surface must be passivated such that the recombination activity of the surface states is suppressed. This is commonly achieved by deposition or growth of a thin film layer or stack of dielectric or other materials on the semiconductor surface, such that the density of surface states at the interface between the semiconductor and this layer or stack is reduced. Commonly, this layer or stack also induces band bending at the semiconductor surface, such that the surface concentration of one type of charge carrier (either electrons or holes) is reduced. This also reduces surface recombination because recombination requires the presence of both carrier types.

Currently, a large number of materials are known to be effective for semiconductor surface passivation. These include silicon oxide, silicon nitride, amorphous silicon, aluminium oxide, aluminium nitride, hafnium oxide, gallium oxide, titanium oxide, and tantalum oxide. Sometimes these materials are combined in stacks.

Most of these materials result in upward band-bending (accumulation of holes) at the semiconductor surface, due to the fact that they contain negative charge states either in the bulk material or near the semiconductor interface (see FIG. 1). This is advantageous for passivation of p-type semiconductor surfaces, but disadvantageous for passivation of n-type semiconductor surfaces. This is because on n-type surfaces such upward band-bending results in the formation of an inversion layer at the surface which facilitates lateral transport of minority carriers to areas of high recombination such as edges, which may lead to shunting. On heavily doped n-type surfaces upward band-bending may even increase rather than reduce surface recombination because the induced band-bending is insufficient to produce full inversion of the surface charge, but only results in depletion or weak inversion of the semiconductor surface.

Known passivation materials which induce downward band-bending (accumulation of electrons) at the semiconductor surface, and are therefore advantageous for passivation of n-type surfaces, include silicon oxide, and silicon nitride, due to the fact that both contain positive charge states. The former however only contains a rather low concentration of charge states (typically $<5 \times 10^{11}$ cm$^{-2}$), such that the contribution of this induced band-bending to reducing surface recombination is rather small. Silicon nitride can have a much larger charge concentration ($>5 \times 10^{12}$ cm$^{-2}$ [Hezel 1989]), however, the charge concentration in passivating silicon nitride films (those which also feature a low density of interface states) is typically somewhat smaller, ranging between about $5 \times 10^{11}$ and $2 \times 10^{12}$ cm$^{-2}$ [Hezel 1989, Schuurmans 1996, Aberle 1999, Dauwe 2002, Wan 2013].

This is significantly smaller than the charge concentrations observed for the best-passivating negatively charged material, aluminium oxide, which typically possesses negative charge concentrations in the range of $2-10 \times 10^{12}$ cm$^{-2}$. There is therefore a gap between the availability of passivation materials with a strong negative charge and those with a strong positive charge.

A second important functionality of thin film materials in semiconductor device fabrication is as dopant sources for the formation of highly doped surface regions in a semiconductor substrate. This has for example been demonstrated using deposited phosphorus- and boron-doped silicon oxides, as well as for phosphosilicate and borosilicate glass grown during standard diffusion processes on silicon. Diffusion of dopant species into the semiconductor substrate may be induced by heating the sample surface to high temperatures, either across the whole surface as in a firing furnace, or only locally using for example laser-induced heating (FIG. 2). A particularly advantageous case occurs when such thin film dopant sources also function as surface passivation layers. This is the case for aluminium oxide, which both provides effective passivation of p-type surfaces due to its large negative charge, and has been shown to function as a dopant source for aluminium doping of silicon via laser doping. This situation is advantageous because it allows the formation of local diffused contact regions which are self-aligned with the surrounding passivation layers, thereby simplifying processing.

Aluminium and phosphorus sit on either side of silicon in the periodic table. Aluminium is a p-type dopant, and phosphorus an n-type dopant in silicon. Aluminium oxide $Al_2O_3$ (films are known to possess a large concentration of negative fixed charge when deposited on silicon. Stoichiometric aluminium phosphate ($AlPO_4$) can be considered to be isoelectronic with silicon oxide ($SiO_2$), which features a small concentration of positive charge at its interface with silicon.

The present invention relates to a photovoltaic cell comprising a silicon substrate having two opposite main surfaces, wherein a first main surface of the two main surfaces is covered with a passivation layer stack, comprising:
- a $PO_x$- and Al-comprising-layer covering the first main surface, and
- a capping layer structure which covers the $PO_x$- and Al-comprising-layer.

The $PO_x$- and Al-comprising-layer is a layer comprising phosphorus, aluminium and oxygen, more particularly a layer comprising a mixture of phosphorus, aluminium and oxide. Such a passivation layer stack can be tailored to obtain an optimal balance between the effective excess carrier lifetime $\tau_{eff}$(s), the fixed charge density $Q_f$ (cm$^{-2}$) and the interface state density $D_{it}$ (eV$^{-1}$ cm$^{-2}$). Preferably, the effective excess carrier lifetime $\tau_{eff}$ is relatively long and the and the interface state density $D_{it}$ is relatively low. The desired fixed charge density $Q_f$ depends on the type of doping, i.e. n- or p-silicon, of the main surface onto which the $PO_x$- and Al-comprising-layer is applied.

For example, the $PO_x$- and Al-comprising-layer may possess a large positive fixed charge, and may provide an excellent passivation of crystalline silicon surfaces. The silicon at the first main surface of the silicon substrate may be doped by the phosphorus in the $PO_x$- and Al-comprising-layer. By this means local, heavily doped regions may be formed which facilitate the formation of electrical contacts to the silicon substrate. The capping layer structure acts as a moisture barrier and provide chemical stability to the $PO_x$- and Al-comprising-layer which, dependent on its content, may be instable relative to the environment.

In some cases, the mixed $PO_x$- and Al-comprising-layer which is embodied as a mixed $AlP_xO_y$-film may be stable and no capping layer has to be applied in that case. In view thereof, the invention also relates to a photovoltaic cell comprising a silicon substrate having two opposite main surfaces, wherein a first main surface of the two main surfaces is covered with a passivation layer stack comprising a $PO_x$- and Al-comprising-layer covering the first main surface, wherein the $PO_x$- and Al-comprising-layer is a mixed $AlP_xO_y$-film. Thereby, the ratio between the atomic percentage of phosphorus and phosphorus+aluminium (P/(P+Al)) in the $PO_x$- and Al-comprising layer may be chosen such that $PO_x$- and Al-comprising layer is stable relative to the outside air. So the ratio is the number of atoms of phosphorus divided by the number of atoms of phosphorus plus aluminium.

The following embodiments are embodiments of both the PV-cell with a capping layer as well the PV-cell without a capping layer. When the PV-cell does not have a capping layer, it is required that the $PO_x$- and Al-comprising-layer is stable relative to the outside air by itself.

In a first embodiment, the $PO_x$- and Al-comprising-layer is a mixed $AlP_xO_y$-film. The ratio between the atomic percentage of phosphorus and phosphorus+aluminium (P/(P+Al)) in the $PO_x$- and Al-comprising layer is thereby tailored to obtain an optimal balance between the effective excess carrier lifetime $\tau_{eff}$ (s), the fixed charge density $Q_f$ ($cm^{-2}$) and the interface state density $D_{it}$ ($eV^{-1}\ cm^{-2}$).

As is clear from FIG. 9b, the atomic percentage of phosphorus and phosphorus+aluminium (P/(P+Al)) in the layer has an impact on the fixed charge density ($Q_f$). By tailoring this ratio, the fixed charge density can be varied from negative to positive charge, in the example from $-12*10^{12}\ cm^{-2}$ to $+14*10^{12}\ cm^{-2}$. The effective excess carrier lifetime $\tau_{eff}$ is preferably long and this can also be obtained by tailoring the ratio between the atomic percentage of phosphorus and phosphorus+aluminium (P/(P+Al)) as is clear from FIG. 9a. The effective excess carrier lifetime $\tau_{eff}$ can even be improved by forming gas annealing and by applying a capping layer of $Al_2O_3$ and optionally subsequent annealing. The interface state density ($D_{it}$) is preferably relatively low and this can also be achieved by tailoring the atomic percentage of phosphorus and phosphorus+aluminium (P/(P+Al)) in the $PO_x$- and Al-comprising layer.

In an embodiment, the ratio between the atomic percentage of phosphorus and phosphorus+aluminium (P/(P+Al)) in the layer is in the range of 0.6 to 1.0. In this range, the effective excess carrier lifetime $\tau_{eff}$ is relatively large, the fixed charge density $Q_f$ is positive and the interface state density $D_{it}$ varies and may be relatively small. This will result in a PV-cell with a good efficiency.

In an embodiment, the ratio between the atomic percentage of phosphorus and phosphorus+aluminium (P/(P+Al)) in the layer is at least 0.5.

In an embodiment, the $PO_x$- and Al-comprising-layer additionally comprises at least one of H, Si, C.

For example H, may be beneficial for reducing the interface state density with the silicon substrate.

Si and additional Al may diffuse in the $PO_x$- and Al-comprising layer in the contact region between the $PO_x$- and Al-comprising layer and the silicon substrate on the one hand and in the contact region between the $PO_x$- and Al-comprising layer and a capping layer structure that comprises $Al_2O_3$ on the other hand.

In an embodiment, a thin $SiO_2$ layer (formed either intentionally or as a by-product of the deposition process) may be present between the Si substrate and the $PO_x$ film so as to minimize the concentration of electrical interface states ($D_{it}$).

In an embodiment, this thin $SiO_2$ layer may have a thickness of 0.5-2 nm.

In an embodiment, the capping layer structure may be an aluminium oxide ($Al_2O_3$) layer. However, note that other materials could possibly be used in this role, especially other oxides or nitrides (e.g. silicon nitride, titanium oxide, silicon oxide etc.). The capping layer structure may also be embodied as a stack of layers, for example a stack of an $Al_2O_3$-layer and $SiN_x$-layer In an embodiment, the $PO_x$- and Al-comprising-layer covering the first main surface may have a thickness of less than 10 nm.

In an embodiment, the capping layer structure on top comprises an aluminium oxide ($Al_2O_3$) layer having a thickness in the range of 2-30 nm, more preferably in the range of 2-5 nm.

In an embodiment, a second main surface of the two main surfaces of the silicon substrate may be covered with an $Al_2O_3$ layer.

The $Al_2O_3$ layer provides an excellent passivation of crystalline silicon surface and possesses a negative fixed charge.

In an embodiment the photovoltaic cell having an $Al_2O_3$ layer on the second main surface may comprise a $SiO_2$ layer between the second main surface and the aluminium oxide ($Al_2O_3$) layer covering the second main surface.

In an embodiment this $SiO_2$ layer may have a thickness in the range of 0.5-2 nm.

In a further elaboration of the embodiment with the aluminium oxide ($Al_2O_3$) layer covering the second main surface, the $Al_2O_3$ layer may be part of a stack which comprises subsequently from the second main surface to the top, the $Al_2O_3$ layer, optionally a $SiO_2$-layer on top of the $Al_2O_3$ layer, and a $SiN_x$ capping layer on top of that.

The present invention also relates to a method for manufacturing a photovoltaic cell, the method comprising:
  providing a silicon substrate having two opposite main surfaces;
  applying a $PO_x$- and Al-comprising-layer on one of the main surfaces of the silicon substrate;
  applying a capping layer structure on top of the $PO_x$- and Al-comprising-layer to cover the $PO_x$- and Al-comprising-layer.

The $PO_x$- and Al-comprising-layer passivates the silicon and may be tailored to obtain an optimal balance between the effective excess carrier lifetime $\tau_{eff}$(s), the fixed charge density $Q_f$ ($cm^{-2}$) and the interface state density $D_{it}$ ($eV^{-1}\ cm^{-2}$). Preferably, the effective excess carrier lifetime $\tau_{eff}$ is relatively long and the and the interface state density $D_{it}$ is relatively low. The desired fixed charge density $Q_f$ depends on the type of doping, i.e. n- or p-silicon, of the main surface onto which the $PO_x$- and Al-comprising-layer is applied.

As stated above in relation to the PV-cell, in some cases, the mixed $PO_x$- and Al-comprising-layer which is embodied as a mixed $AlP_xO_y$-film may be stable and no capping layer has to be applied in that case. In view thereof, the invention also relates to a method for manufacturing a photovoltaic cell, the method comprising:

providing a silicon substrate having two opposite main surfaces;

applying a $PO_x$- and Al-comprising-layer on one of the main surfaces of the silicon substrate, wherein the $PO_x$- and Al-comprising-layer is a mixed $AlP_xO_y$-film. Thereby, the ratio between the atomic percentage of phosphorus and phosphorus+aluminium (P/(P+Al)) in the $PO_x$- and Al-comprising layer may be chosen such that the $PO_x$- and Al-comprising layer is stable relative to the outside air.

The following embodiments of the method according to the invention both relate to embodiments of the method for manufacturing the PV-cell with a capping layer as well as to embodiments of the method for manufacturing the PV-cell without a capping layer. When the PV-cell does not have a capping layer, it is required that the $PO_x$- and Al-comprising-layer is stable relative to the outside air by itself.

In an embodiment, the $PO_x$- and Al-comprising-layer is a mixed $AlP_xO_y$-film which is formed by:

by applying a number of $PO_x$-layers and a number of Al-containing layers, wherein the ratio between the atomic percentage of phosphorus and phosphorus+aluminium (P/(P+Al)) in the $PO_x$- and Al-comprising-layer is tailored to obtain an optimal balance between the effective excess carrier lifetime $\tau_{eff}(s)$, the fixed charge density $Q_f (cm^{-2})$ and the interface state density $D_{it} (eV^{-1} cm^{-2})$, wherein the tailoring is effected by applying a desired number of $PO_x$-layers and a desired number of Al-comprising layers for forming the mixed $AlP_xO_y$-film.

By applying a desired number of $PO_x$-layers and a desired number of Al-comprising layers, e.g. $Al_2O_3$-layers, the ratio P/(P+Al) within the $PO_x$- and Al-comprising-layer can be exactly obtained as desired. Especially when the layers are formed by ALD, for example in a spatial atmospheric system as the one marketed under the brand name Levitrack, the $PO_x$-layers and the $Al_2O_3$-layers are monolayers and the ratio P/(P+Al) within the $PO_x$- and Al-comprising-layer can be defined exactly.

In an embodiment, the ratio between the atomic percentage of phosphorus and phosphorus+aluminium (P/(P+Al)) in the layer is in the range of 0.6 to 1.0.

In an embodiment, the $PO_x$- and Al-comprising-layer may formed by applying at least one $PO_x$-layer and by applying at least one Al-containing layer and subsequently anneal the stack of the at least one $PO_x$-layer and the at least one Al-containing layer so as to mix the Al and P to obtain a mixed $AlP_xO_y$ film.

In an embodiment, the $PO_x$-layers and Al-comprising layers are alternately applied so as to form a stack of layers. Such an alternating stack of $PO_x$-layers and Al-containing layers leads to a very well mixed $AlP_xO_y$ film after annealing.

In an embodiment, the application of at least one $PO_x$-layer and at least one Al-containing layer and a subsequent $PO_x$-layer and a subsequent Al-comprising layer an intermediate anneal step is performed so as to mix the Al and P in the previously applied at least one $PO_x$-layer and at least one Al-containing layer to obtain a mixed $AlP_xO_y$ film on top of which the subsequent $PO_x$-layer and a subsequent Al-containing layer are applied.

When annealing is done several times during the formation of the $AlP_xO_y$ film, a very homogeneous content of the mixed $AlP_xO_y$ film will be obtained.

In an embodiment, first the $PO_x$-layers and Al-comprising-layers are alternately applied so as to form the stack of layers and subsequently the stack of layers is annealed so as to mix the Al and P to obtain a mixed $AlP_xO_y$ film. In this embodiment, the annealing is done after all the layers of the $PO_x$- and Al-comprising-layer are applied. It may depend on the type of layer application process whether intermediate annealing is preferred or whether annealing after application of the entire stack of $PO_x$-layers and Al-comprising-layers is preferred. In a spatial atmospheric system as the one marketed under the brand name Levitrack, the intermediate annealing is feasible without almost any delay in the formation of the PV-cell.

In an embodiment, the applying of the $PO_x$- and Al-comprising-layer on the first main surface may be effected by means of pulsed, spatial or batch atomic layer deposition (ALD) or pulsed, spatial or batch chemical vapour deposition (CVD).

In a further elaboration of this embodiment, the pulsed, spatial or batch chemical vapour deposition (CVD) may be pulsed, spatial or batch plasma enhanced chemical vapour deposition (PECVD).

In an embodiment, the pulsed, spatial or batch atomic layer deposition (ALD) or pulsed, spatial or batch chemical vapour deposition (CVD) for the applying of the $PO_x$- and Al-comprising-layer on the first main surface may be done by alternately exposing the surface to trimethyl phosphate (TMP) and an O-containing reactant, chosen from the group comprising O2 plasma, $H_2O$, $O_3$ and $H_2O_2$ and alternately exposing the surface to trimethyl aluminium (TMA) and an O-containing reactant, chosen from the group comprising $O_2$ plasma, $H_2O$, $O_3$ and $H_2O_2$.

In an embodiment, the first main surface may be exposed to a purge gas, such as $N_2$, between each exposure to trimethyl phosphate and exposure to the O-containing reactant. Thereby, the first main surface may also be exposed to a purge gas, such as $N_2$, between each exposure to trimethyl aluminium and exposure to the O-containing reactant. In an embodiment, the pulsed, spatial or batch atomic layer deposition (ALD) or pulsed, spatial or batch chemical vapour deposition (CVD) may performed in an atmospheric ALD or CVD systems, such as the spatial atmospheric system marketed under the brand name Levitrack.

In an embodiment, the pulsed, spatial or batch atomic layer deposition (ALD) or pulsed, spatial or batch chemical vapour deposition (CVD) may be performed in a low-pressure deposition system.

With a low-pressure deposition system, a system is meant in which the pressure is subatmospheric.

In an embodiment, the applying of the $PO_x$- and Al-comprising-layer on the first main surface of the silicon substrate may effected at a temperature in the range of 20-250° C., more preferably 80-120° C.

In an embodiment, the applying of the capping layer structure may comprise the applying of an $Al_2O_3$ layer.

In an embodiment, the applying of the $Al_2O_3$ layer may effected in the same atmospheric spatial ALD system as the applying of the $PO_x$- and Al-comprising-layer and immediately follows the applying of the $PO_x$- and Al-comprising-layer without removing the substrate from the atmospheric spatial ALD system so that the $PO_x$- and Al-comprising-layer is not exposed to air or moisture before the capping layer structure of $Al_2O_3$ is applied onto the $PO_x$- and Al-comprising-layer.

In an embodiment, the applying of the $PO_x$- and Al-comprising-layer and the applying of the $Al_2O_3$ layer may be effected in different modules of an ALD, CVD and/or PECVD system, in which air exposure of the $PO_x$- and Al-comprising-layer is avoided by transferring the substrates from a module in which the $PO_x$- and Al-comprisinglayer is applied to a module in which the $Al_2O_3$ layer is applied in an inert ambient or in vacuum.

In an embodiment, the applying of the $Al_2O_3$ capping layer is effected at a temperature in the range of 20-300° C., more preferably 150-250° C. and even more preferably 180-220° C.

The invention is further elucidated in the detailed description with reference to the following figures.

Figure 1:
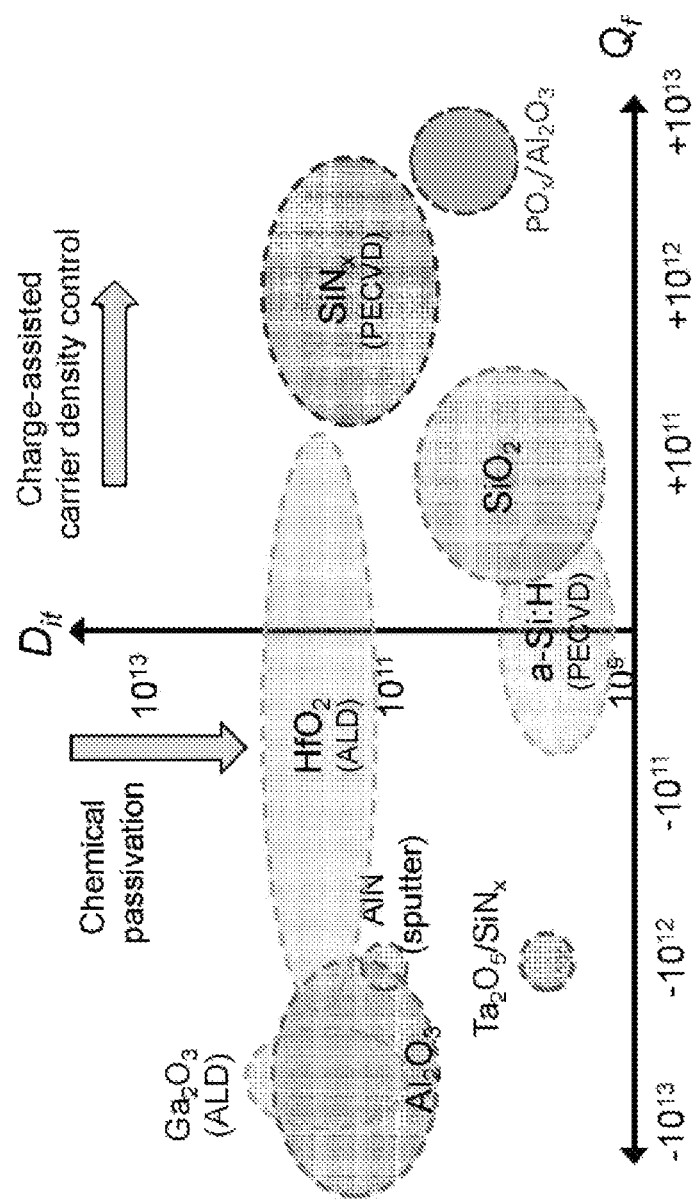
FIG. 1. Summary of passivating coatings on silicon in terms of fixed charge $Q_f$ and density of interface traps $D_{it}$, taken from Cuevas et al. [Cuevas 2015], where we have added our data for $PO_x/Al_2O_3$ (the exact value of $D_{it}$ and $Q_f$ will depend on the details of the deposition process conditions).
Figure 2:
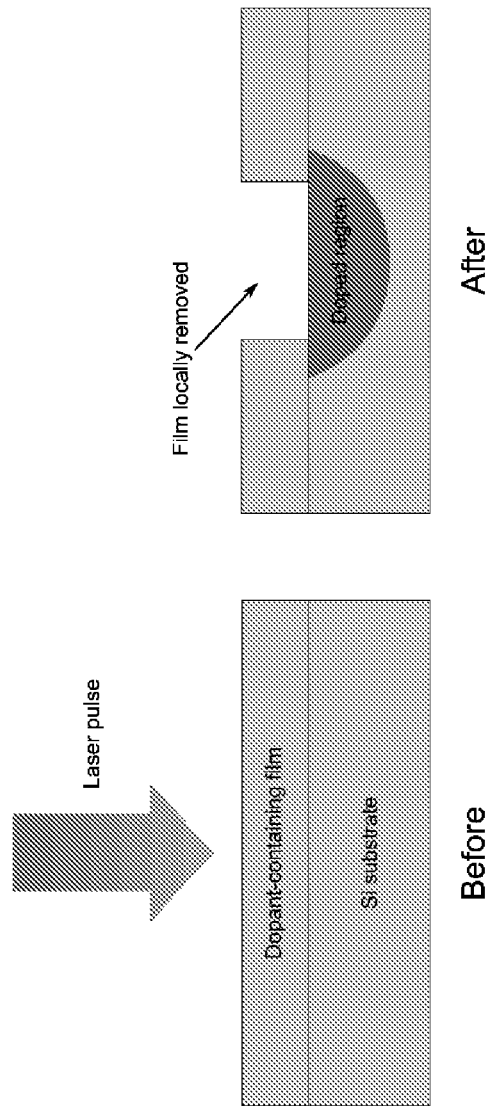
FIG. 2. Schematic illustration of laser doping process from a dopant containing film. The laser pulse locally heats the film, creating local openings in the film and causing dopants to diffuse into the silicon, forming a localised heavily doped region at the surface.
Figure 3B:
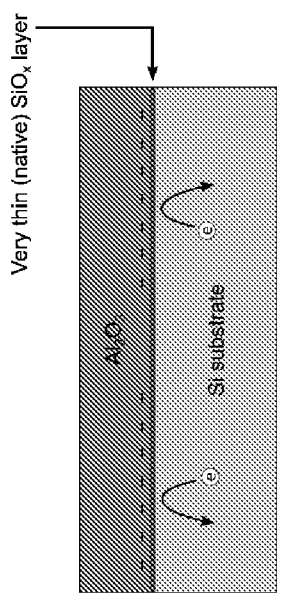
FIG. 3b Diagram of a silicon surface passivated by the proposed $PO_x/Al_2O_3$ stack. Positive fixed charges in the film repel positively charged holes from the interface, resulting in effective passivation especially of n-type surfaces.
Figure 3A:
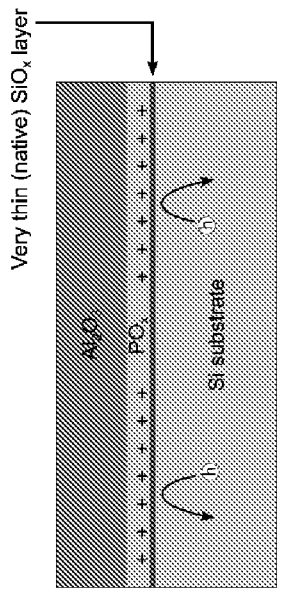
FIG. 3a Diagram of a silicon surface passivated by $Al_2O_3$, which is a currently known structure for surface passivation. Negative fixed charges in the film repel negatively charged electrons from the interface, resulting in effective passivation especially of p-type surfaces.
Figure 4B:
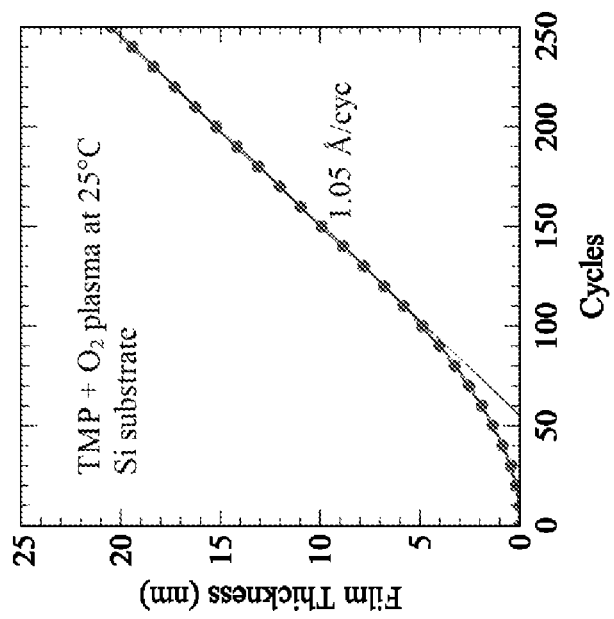
FIG. 4b $PO_x$ film thickness vs number of cycles at 25° C. for dose times of 500 ms, 1 s, and 2 s (bubbler temperature 25° C.).
Figure 4A:
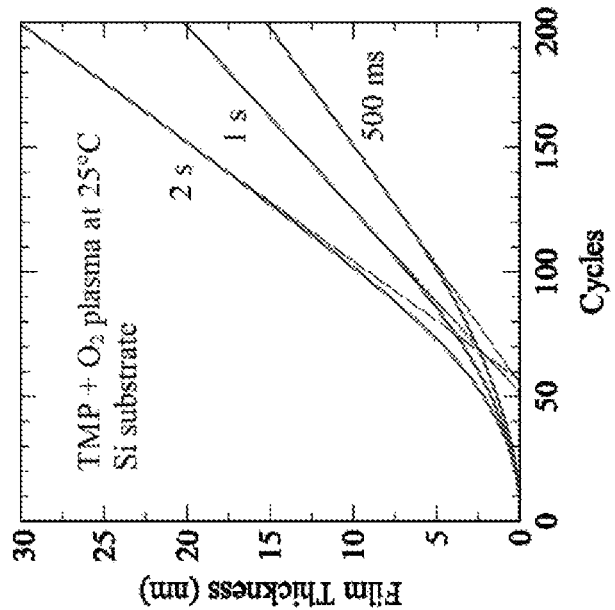
FIG. 4a $PO_x$ film thickness vs number of deposition process cycles at a temperature of 25° C. and 500 ms TMP dose time (bubbler temperature 25° C.).
Figure 4D:
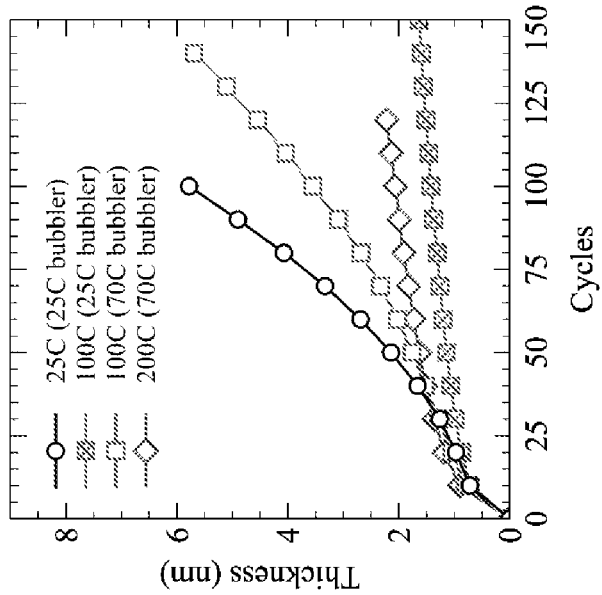
FIG. 4d $PO_x$ film thickness vs number of cycles at deposition temperatures of 25, 100, and 200° C. and for bubbler temperatures of 25° C. and 70° C.
Figure 4C:
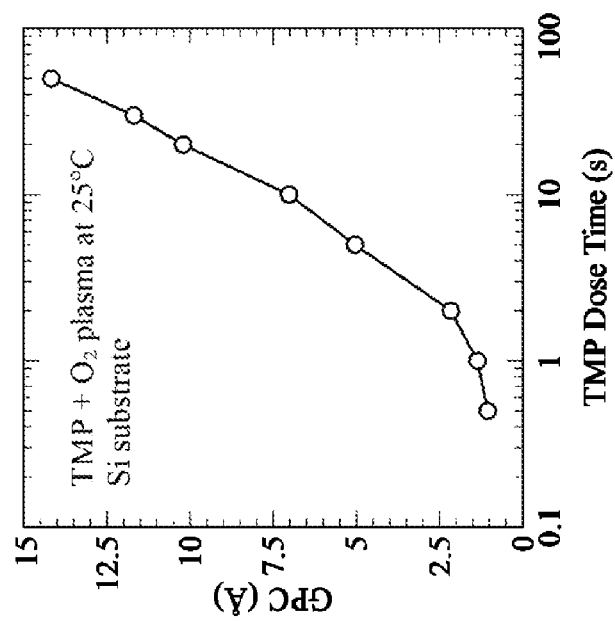
FIG. 4c Steady-state GPC vs TMP dose time at 25° C. (bubbler temperature 25° C.).

DETAILED DESCRIPTION $PO_x$ films were deposited on a main surface of a silicon substrate in an atomic layer deposition (ALD) reactor at temperatures between 25 and 100° C. by exposing samples alternately to trimethyl phosphate (TMP) and an $O_2$ plasma reactant in a cyclic fashion, with separating $N_2$ purges. This process resulted in linear thin film growth following an initial nucleation delay, with a growth-per-cycle (GPC) of between 0.5 and 1.1 Å depending on the temperature and TMP exposure time (saturation of the GPC with respect to the precursor dose was not observed, at least at a deposition temperature of 25° C., so that this process should be considered a pulsed chemical vapour deposition process rather than true ALD). Note that other phosphorus-containing precursors, and other reactants (e.g. $H_2O$, $O_3$, $H_2O_2$), could potentially be used in place of TMP and $O_2$ plasma to deposit the $PO_x$ layer in a similar manner. It may also be possible to use other deposition methods to deposit the $PO_x$ layer in place of ALD, for example chemical vapour deposition, evaporation, sputtering, or solution-based methods.

$Al_2O_3$ capping layers were deposited in-situ immediately following $PO_x$ deposition at the same temperature using trimethyl aluminium (TMA) and $O_2$ plasma. The $Al_2O_3$ films could in principle also be deposited using other precursors or reactants, or by other deposition methods. The $Al_2O_3$ capping layer could also possibly be replaced by another material with suitable moisture barrier properties, for example silicon nitride or titanium oxide.

Deposition of the passivation stacks was performed in a low-pressure (base pressure of $\sim 10^{-6}$ Torr) deposition system with a low concentration of water vapour. Alternatively, the stacks could also be deposited in atmospheric ALD or CVD systems, such as in e.g. the Levitrack tool that is currently marketed for $Al_2O_3$ deposition. Uncapped $PO_x$ films were observed to visibly degrade within minutes on exposure to atmosphere, with the formation of fractal cracking patterns and blisters, presumably due to atmospheric moisture. In contrast, $PO_x$ films capped by $Al_2O_3$ appeared to be stable over weeks and months of atmospheric exposure. Gradual blister formation was observed for thicker $PO_x$ films (~5-10 nm) capped by $Al_2O_3$ in an as-deposited state. Annealing such stacks at a temperature of 200° C. in $N_2$ for 1 minute immediately following deposition resulted in improved stability and blister-free films. $PO_x$ films thicker than 10 nm and capped by $Al_2O_3$ exhibited significant cracking within minutes of exposure to atmosphere and significant blistering on annealing. Therefore, $PO_x$ film thickness is preferably kept below 10 nm.

To avoid air exposure of the rather reactive $PO_x$ film, the deposition of the $PO_x/Al_2O_3$ stack could be carried out in one integrated process flow in a spatial ALD system such as the Levitrack tool. In such a system different precursors can be injected at different segments along the track that are heated to different temperatures. In that way it is possible to carry out the two processes at different temperature, e.g. $PO_x$ at 100° C., and $AlO_x$ at 200° C., without exposure to air in between.

Figure 5:
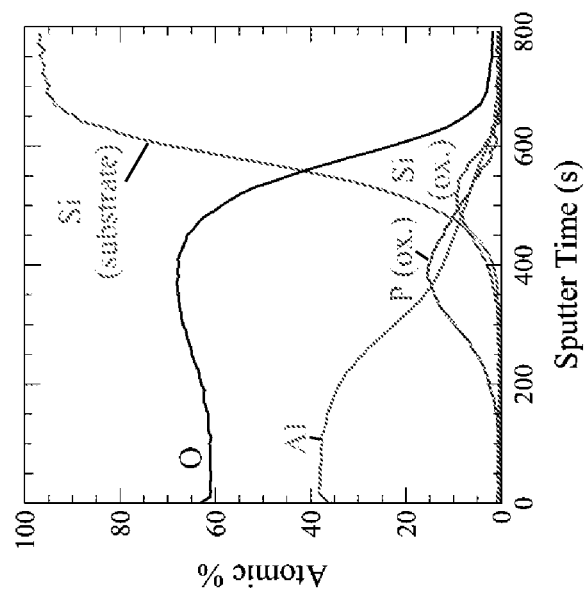
FIG. 5 Relative atomic composition determined by XPS vs sputter time for a $PO_x/Al_2O_3$ stack deposited at 100° C. on a polished (100) Si substrate.

X-ray photoelectron spectroscopy (XPS) compositional depth profiling (using sputtering) of $PO_x/Al_2O_3$ stacks (FIG. 5) showed the existence of a $PO_x$- and Al-comprising-layer below the $Al_2O_3$ capping layer, i.e. $AlP_xO_y$ layer. There is also a thin silicon oxide ($SiO_x$) layer likely formed by $O_2$ plasma exposure during the initial deposition cycles when the $PO_x$ is still nucleating. Carbon concentrations were below the detection limit (<1%) through the whole stack.

To investigate the passivation properties of these layers, 5-6 nm thick $PO_x$ films were deposited in an atomic layer deposition (ALD) reactor from trimethyl phosphate (TMP) using an $O_2$ plasma reactant at temperatures of 25 and 100° C. 15 nm thick $Al_2O_3$ capping layers were deposited in-situ at the same temperature using trimethyl aluminium (TMA) and $O_2$ plasma. Control samples featuring $Al_2O_3$ only (without $PO_x$) were deposited in the same way. Symmetric carrier lifetime test structures were fabricated on 280 µm thick double-side-polished float-zone (100) 1-5 Ω cm n-type Si wafers, which received a standard RCA clean and HF dip immediately prior to $PO_x/Al_2O_3$ or $Al_2O_3$ deposition. Following deposition, samples were annealed consecutively at a series of increasing temperatures for 10 minutes in $N_2$. Carrier lifetime measurements were performed using a Sinton WCT-120TS photoconductance lifetime tester.

Figures 6A, 6B:
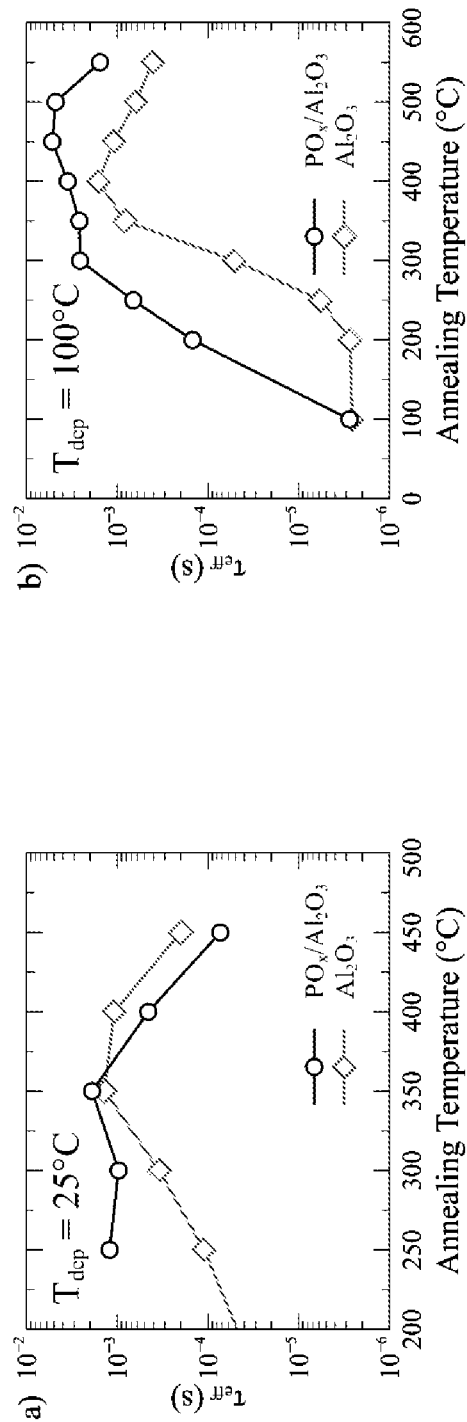
FIG. 6a Effective excess carrier lifetime $\tau_{\mathit{eff}}$ ($\Delta n=10^{15}$ cm-3) vs annealing temperature for n-type Si (100) passivated by $PO_x/Al_2O_3$ stacks deposited at 25° C. and by the same $Al_2O_3$ films without $PO_x$. Annealing was performed consecutively for 10 minutes at each temperature in $N_2$.
FIG. 6b Effective excess carrier lifetime $\tau_{\mathit{eff}}$ ($\Delta n=10^{15}$ cm-3) vs annealing temperature for n-type Si (100) passivated by $PO_x/Al_2O_3$ stacks deposited at 100° C. and by the same $Al_2O_3$ films without $PO_x$. Annealing was performed consecutively for 10 minutes at each temperature in N2.

FIG. 6 shows the measured effective excess carrier lifetime $\tau_{eff}$ as a function of post-deposition annealing temperature for samples passivated by $PO_x/Al_2O_3$ or by $Al_2O_3$ only. Two points are immediately clear. Firstly, $PO_x/Al_2O_3$ is capable of providing excellent levels of surface passivation, comparable or better than that of plasma ALD $Al_2O_3$ films deposited at the same temperature, with peak lifetimes of 1.9 ms and 5.2 ms for stacks deposited at 25 and 100° C. respectively (it should be noted that these temperatures are not optimal for $Al_2O_3$ passivation). Secondly, the dependence of passivation quality on annealing temperature is fundamentally different for $PO_x/Al_2O_3$ stacks compared to $Al_2O_3$ alone. In particular, a significant increase in lifetime is observed at significantly lower annealing temperatures, with lifetimes on the order of 1 ms observed already after annealing for 10 minutes at 250° C. The latter point shows clearly that the passivation provided by the $PO_x/Al_2O_3$ stacks is not simply due to the $Al_2O_3$ capping layer, and that the interfaces formed by these two materials with c-Si are fundamentally dissimilar. The passivation of films deposited at 25° C. was observed to degrade already on annealing at 400° C., but the lifetime of films deposited at 100° C. degraded only at 550° C.

Figure 7B:
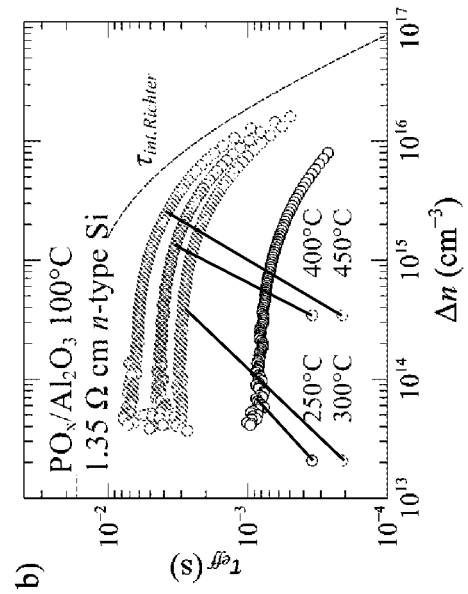
FIG. 7b Effective excess carrier lifetime $\tau_{\mathit{eff}}$ vs excess carrier concentration $\Delta n$ as a function of cumulative annealing temperature for n-type FZ Si (100) wafers passivated by $PO_x/Al_2O_3$ stacks deposited at 100° C. Dashed lines show the intrinsic Si lifetime $\tau_{int}$ as parameterised by Richter et al [Richter 2012].
Figure 7A:
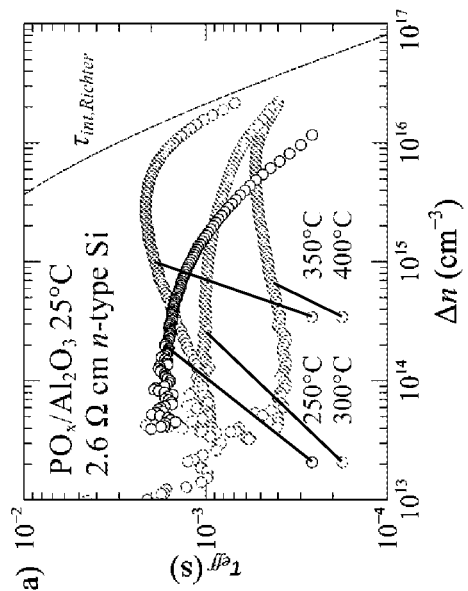
FIG. 7a Effective excess carrier lifetime $\tau_{\mathit{eff}}$ vs excess carrier concentration $\Delta n$ as a function of cumulative annealing temperature for n-type FZ Si (100) wafers passivated by $PO_x/Al_2O_3$ stacks deposited at 25° C. Dashed lines show the intrinsic Si lifetime $\tau_{int}$ as parameterised by Richter et al [Richter 2012].
Figure 8B:
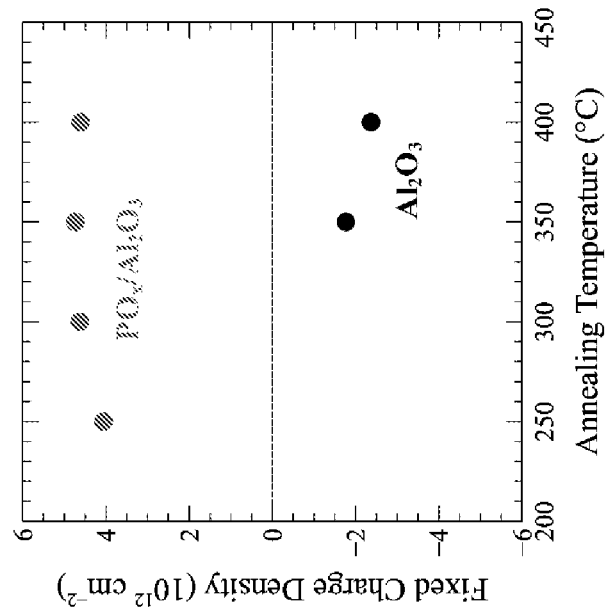
FIG. 8b Corresponding fixed charge density determined from the data of FIG. 8a as a function of annealing temperature.
Figure 8A:
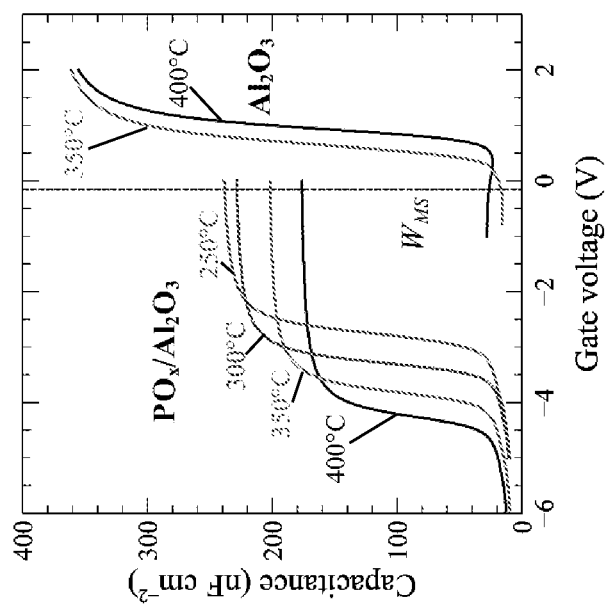
FIG. 8a High-frequency capacitance-voltage curves measured for $PO_x/Al_2O_3$ stacks deposited at 100° C. and the same $Al_2O_3$ films without $PO_x$ on silicon, where the samples were annealed at various temperatures for 10 min in N2 prior to metallisation.

Closer examination of the injection-dependent lifetime data (FIG. 7) reveals some further differences between films deposited at 25 and 100° C. The lifetime of samples passivated at 25° C. after annealing at 250° C. is well-described by a single-diode model, with a saturation current density $J_0$ of 44 $fA/cm^2$ per side, suggesting that the surface is strongly accumulated or inverted due to charge in the dielectric stack. Following annealing at higher temperatures the lifetime simultaneously increases in high injection, while decreasing in low injection, such that the surface recombination can no longer be adequately parameterized by $J_0$. In contrast, the stacks deposited at 100° C. exhibit single diode behaviour over a much wider temperature range, with an exceptionally low $J_0$ of ~6 $fA/cm^2$ per side observed after annealing at 450° C. A deposition temperature of 100° C. therefore appears preferable. These differences in injection dependence may relate to differences in the magnitude of fixed charge. Interestingly, stacks deposited at both temperatures exhibit similarly high lifetimes in high injection, with corresponding 1-Sun implied open-circuit voltages of ~725 mV. These represent exceptionally high values and show the outstanding passivation potential of such stacks. The fixed charge concentration $Q_f$ of the $PO_x/Al_2O_3$ stacks was determined using high-frequency (1 MHz) capacitance-voltage measurements (FIG. 8). A positive fixed charge of between 4 and $4.6 \times 10^{12}$ $cm^{-2}$ was found for $PO_x/Al_2O_3$ stacks deposited at 100° C. and annealed at temperatures of 250-400° C., compared to a negative fixed charge of around $2 \times 10^{12}$ $cm^{-2}$ for the same $Al_2O_3$ films without $PO_x$. This charge is significantly larger than that of standard silicon nitride ($SiN_x$) films commonly used to passivate n-type silicon surfaces. The capacitance-voltage measurements also indicate that the investigated $PO_x/Al_2O_3$ stacks feature a very low density of interface states ($D_{it}$), comparable or lower than that of $Al_2O_3$, and significantly lower than that of $SiN_x$, which along with the large fixed charge accounts for the excellent passivation of these stacks. This is likely due to the formation of a well-controlled $SiO_x$ interface and effective hydrogenation by the capping $Al_2O_3$.

Figure 9B:
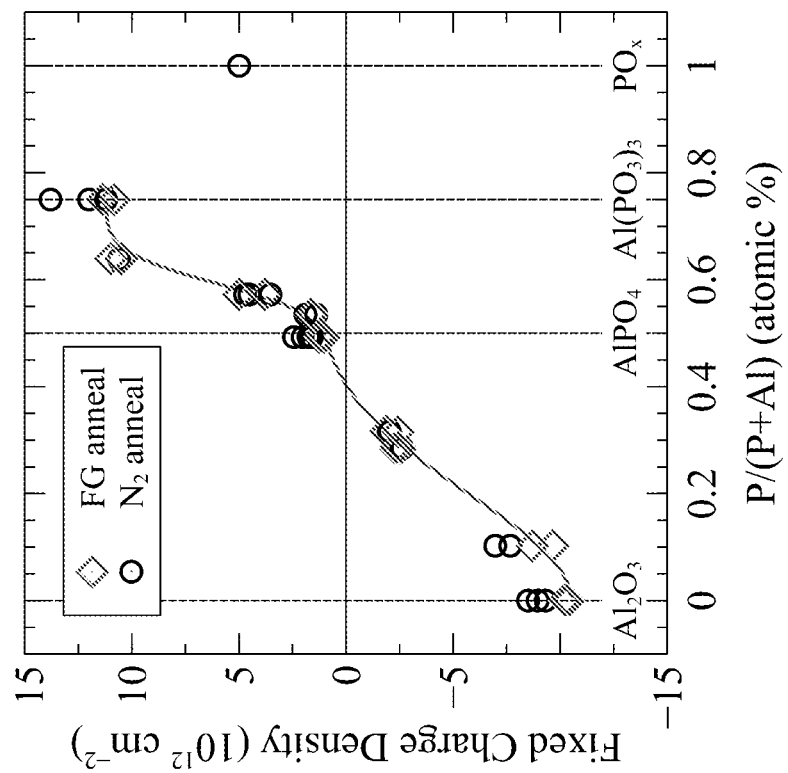
FIG. 9b Fixed charge density $Q_f$ vs the ratio between the atomic percentage of phosphorus and phosphorus+aluminium (P/(P+Al)) in the layer.
Figure 9A:
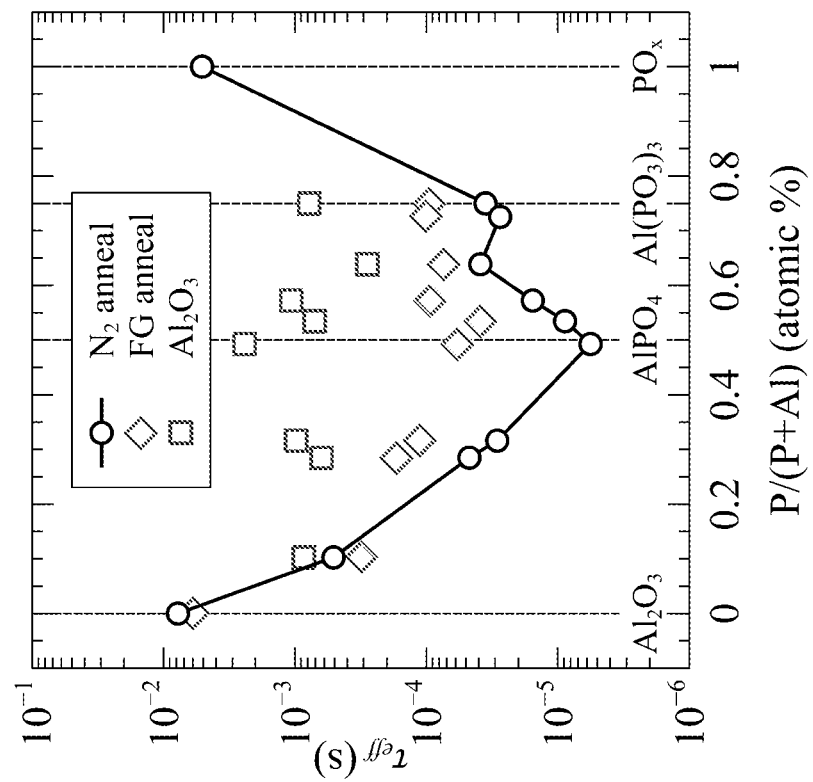
FIG. 9a Effective excess carrier lifetime $\tau_{\mathit{eff}}$ vs the ratio between the atomic percentage of phosphorus and phosphorus+aluminium (P/(P+Al)) in the layer.

FIG. 9a shows the effective excess carrier lifetime $\sigma_{eff}$ vs the ratio between the atomic percentage of phosphorus and phosphorus+aluminium (P/(P+Al)) in the layer. From this figure it is clear that the effective excess carrier lifetime is high when the ratio P/(P+Al) is between 0-0.15 and between 0.7-1.0. Forming gas annealing and the application of a capping layer of $Al_2O_3$ improve the excess carrier lifetime so that even in along the entire ratio range good values for the effective excess carrier lifetime may be obtained.

FIG. 9b shows the fixed charge density $Q_f$ ($cm^{-2}$) vs the ratio between the atomic percentage of phosphorus and phosphorus+aluminium (P/(P+Al)) in the layer. From diagram it is clear that the fixed charge density can be tailored from negative to positive as desired by changing the ratio between the atomic percentage of phosphorus and phosphorus+aluminium (P/(P+Al)) in the layer. In the range between 0.6-1.0 the fixed charge density is between 14 and 2. In this range of 0.6-1.0 a good value of the fixed charge density may be obtained and at the same time a very low interface state density may be obtained as well, which is advantageous.

Figure 9C:
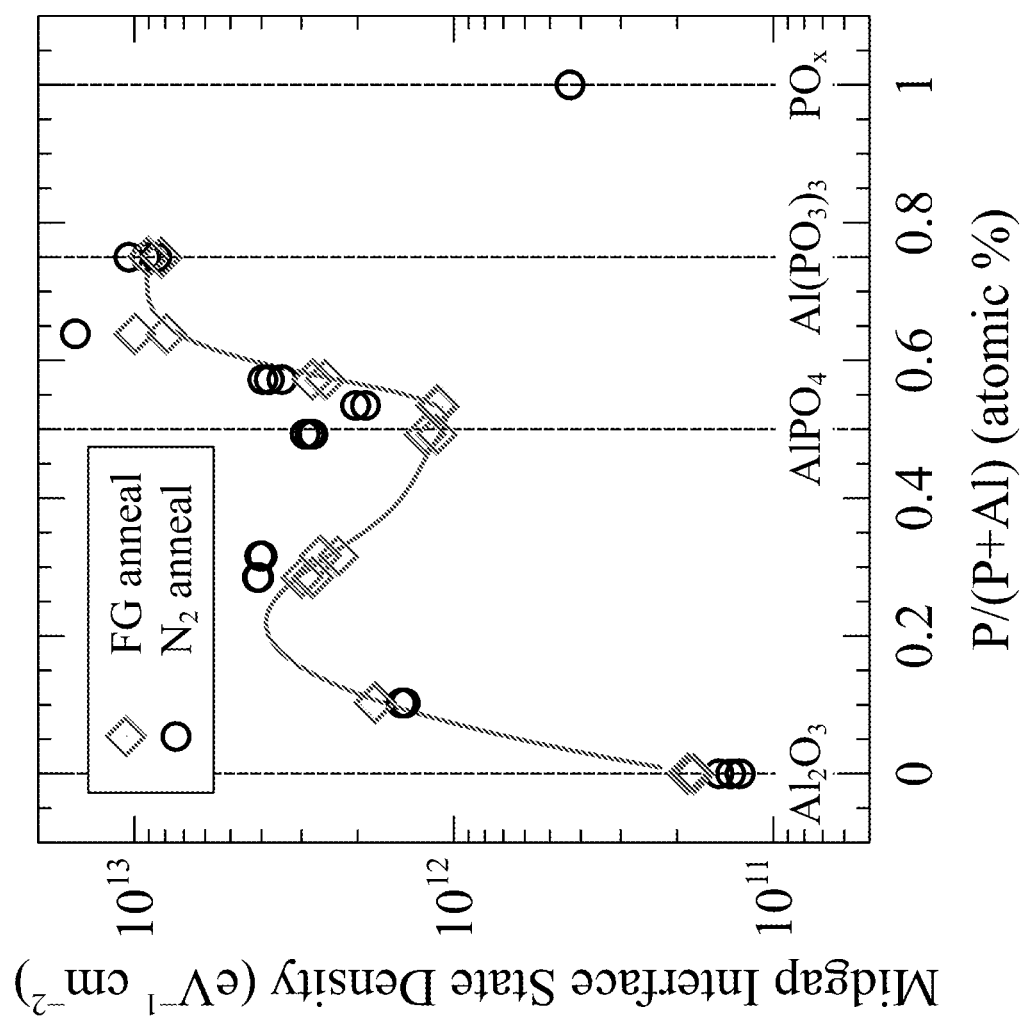
FIG. 9c Interface state density $D_{it}$ vs the ratio between the atomic percentage of phosphorus and (phosphorus+aluminium) (P/(P+Al)) in the layer.

FIG. 9c shows the interface state density $D_{it}$ ($eV^{-1}$ $cm^{-2}$) vs the ratio between the atomic percentage of phosphorus and (phosphorus+aluminium) (P/(P+Al)) in the layer. A low interface state density and a relatively high positive fixed charge density may be obtained when the ratio between the atomic percentage of phosphorus and phosphorus+aluminium (P/(P+Al)) in the layer is between 0.6-1.0.

The invention is not limited to the examples described in the detailed description.

LIST OF REFERENCES

[Hezel 1989]: Hezel, R., and K. Jaeger. "Low-temperature surface passivation of silicon for solar cells." *Journal of the Electrochemical Society* 136, no. 2 (1989): 518-523. DOI: 10.1149/1.2096673

[Schuurmans 1996]: Schuurmans, F. M., A. Schonecker, J. A. Eikelboom, and W. C. Sinke. "Crystal-orientation dependence of surface recombination velocity for silicon nitride passivated silicon wafers." In *Photovoltaic Specialists Conference*, 1996., *Conference Record of the Twenty Fifth IEEE*, pp. 485-488. IEEE, 1996.
DOI: 10.1109/PVSC.1996.564049

[Alerbe 1999]: Aberle, Armin G. *Crystalline silicon solar cells: advanced surface passivation and analysis*. Centre for Photovoltaic Engineering. University of New South wales, 1999.

[Dauwe 2002]: Dauwe, Stefan, Jan Schmidt, Axel Metz, and Rudolf Hezel. "Fixed charge density in silicon nitride films on crystalline silicon surfaces under illumination." In *Photovoltaic Specialists Conference*, 2002. *Conference Record of the Twenty-Ninth IEEE*, pp. 162-165. IEEE, 2002.
DOI: 10.1109/PVSC.2002.1190481

[Wan 2013]: Wan, Yimao, Keith R. McIntosh, and Andrew F. Thomson. "Characterisation and optimisation of PECVD SiNx as an antireflection coating and passivation layer for silicon solar cells." *AIP Advances* 3, no. 3 (2013): 032113.
DOI: 10.106.3/1.4795108

[Richter 2012]: A. Richter, S. W. Glunz, F. Werner, J. Schmidt, and A. Cuevas, "Improved quantitative description of Auger recombination in crystalline silicon," *Phys. Rev. B* vol. 86, no. 165202, 2012

[Cuevas 2015] Cuevas, Andres, Thomas Allen, James Bullock, Yimao Wan, and Xinyu Zhang. "Skin care for healthy silicon solar cells." In *Photovoltaic Specialist Conference (PVSC)*, 2015 *IEEE 42nd*, pp. 1-6. IEEE, 2015.
DOI: 10.1109/PVSC.2015.7356379

The invention claimed is:

1. A photovoltaic cell comprising:
a silicon substrate having two opposite main surfaces, wherein a first main surface of the two main surfaces is covered with a passivation layer stack, comprising:
a $PO_x$- and Al-comprising-layer applied directly to the first main surface; and
a capping layer structure covering the PO, and Al-comprising-layer,
wherein the $PO_x$- and Al-comprising-layer is a mixed $AlP_xO_y$-film, and a ratio between the atomic percentage of phosphorus and phosphorus+aluminum (P/(P+Al)) in the $PO_x$- and Al-comprising-layer is at least 0.6 to less than 1.

2. The photovoltaic cell according to claim 1,
wherein the ratio between the atomic percentage of phosphorus and phosphorus+aluminum (P/(P+Al)) in the $PO_x$- and Al-comprising layer is tailored to obtain an optimal balance between the effective excess carrier lifetime $\tau_{eff}(s)$, the fixed charge density $Q_f(cm^{-2})$ and the interface state density $D_{it}$ ($eV^{-1}$ $cm^{-2}$).

3. The photovoltaic cell according to claim 1, wherein the PO, and Al-comprising-layer additionally comprises at least one of H, Si, C.

4. The photovoltaic cell according to claim 1, further comprising an $SiO_2$ layer covering the first main surface,
wherein the $SiO_2$ layer is between the first main surface and the $PO_x$- and Al-comprising-layer.

5. The photovoltaic cell of claim 4, wherein the $SiO_2$ layer is a layer having a thickness in the range of 0.5-2 nm.

6. The photovoltaic cell according to claim 1, wherein the capping layer structure comprises an aluminum oxide ($Al_2O_3$) layer.

7. The photovoltaic cell according to claim 1, wherein the capping layer structure comprises a stack of layers.

8. The photovoltaic cell according to claim 1, wherein the capping layer structure comprises a layer chosen from the group consisting of $SiN_x$, $TiO_x$, and $SiO_x$.

9. The photovoltaic cell according to claim 1, wherein the $PO_x$- and Al-comprising-layer covering the first main surface has a thickness of less than 10 nm.

10. The photovoltaic cell according to claim 1, wherein the capping layer structure is an aluminum oxide ($Al_2O_3$) layer having a thickness in the range of 2-30 nm.

11. The photovoltaic cell according to claim 1, wherein a second main surface of the two main surfaces is covered with an aluminum oxide ($Al_2O_3$) layer.

12. The photovoltaic cell according to claim 11, further comprising:
a $SiO_2$ layer between the second main surface and the aluminum oxide ($Al_2O_3$) layer covering the second main surface.

13. The photovoltaic cell of claim 12, wherein the $SiO_2$ layer is a layer having a thickness in the range of 0.5-2 nm.

14. The photovoltaic cell according to claim 11, wherein the $Al_2O_3$ layer is part of a stack which comprises subsequently from the second main surface to the top, the $Al_2O_3$ layer, a $SiO_2$-layer on top of the $Al_2O_3$ layer, and a $SiN_x$ capping layer on top of the $SiO_2$-layer.

15. A method for manufacturing a photovoltaic cell, the method comprising the steps of:
providing a silicon substrate having two opposite main surfaces;
applying a $PO_x$- and Al-comprising-layer directly on a first main surface of the two opposite main surfaces of the silicon substrate; and
applying a capping layer structure on top of the PO, and Al-comprising-layer to cover the $PO_x$- and Al-comprising-layer,
wherein $PO_x$- and Al-comprising-layer is a mixed $AlP_xO_y$-film, and a the ratio between the atomic percentage of phosphorus and phosphorus+aluminum (P/(P+Al)) in the $PO_x$- and Al-comprising-layer is from at least 0.6 to less than 1.

16. The method according to claim 15, wherein the mixed $AlP_xO_y$-film formed by applying a number of $PO_x$-layers and a number of Al-containing layers, wherein the ratio between the atomic percentage of phosphorus and phosphorus+aluminium aluminum (P/(P+Al)) in the $PO_x$- and Al-comprising-layer is tailored to obtain an optimal balance between the effective excess carrier lifetime $\tau_{eff}(s)$, the fixed charge density $Q_f(cm^{-2})$ and the interface state density DA ($eV^{-1}$ $cm^{-2}$), and
wherein the tailoring is effected by applying a desired number of $PO_x$-layers and a desired number of Al-comprising layers for forming the mixed $AlP_xO_y$-film.

17. The method according to claim 15, wherein the $PO_x$- and Al comprising-layer is formed by applying at least one $PO_x$-layer and by applying at least one Al-containing layer and subsequently annealing the stack of the at least one $PO_x$-layer and the at least one Al-containing layer so as to mix the Al and P to obtain the mixed $AlP_xO_y$ film.

18. The method according to claim 15, wherein the $PO_x$-layers and Al-containing layers are alternately applied so as to form a stack of layers.

19. The method according to claim 18, wherein between the application of at least one $PO_x$-layer and at least one Al-containing layer and a subsequent $PO_x$-layer and a subsequent Al-containing layer an intermediate anneal step is performed so as to mix the Al and P in the previously applied at least one $PO_x$-layer and at least one Al-containing layer to obtain the mixed $AlP_xO_y$ film on top of which the subsequent $PO_x$-layer and a subsequent Al-containing layer are applied.

20. The method according to claim 18, wherein first the $PO_x$-layers and Al-containing layers are alternately applied so as to form the stack of layers and subsequently the stack of layers is annealed so as to mix the Al and P to obtain the mixed $AlP_xO_y$ film.

21. The method according to claim 15, wherein the applying of the $PO_x$- and Al-comprising-layer on the first main surface is effected by means of pulsed, spatial or batch atomic layer deposition (ALD) or pulsed, spatial or batch chemical vapour deposition (CVD).

22. The method according to claim 21, wherein the pulsed, spatial or batch atomic layer deposition (ALD) or pulsed, spatial or batch chemical vapour deposition (CVD) for the applying of the PO, and Al-comprising-layer on the first main surface is done by alternately exposing the surface to trimethyl phosphate (TMP) and an O-containing reactant, chosen from the group comprising $O_2$ plasma, $H_2O$, $O_3$ and $H_2O_2$ and alternately exposing the surface to trimethyl aluminum (TMA) and an O-containing reactant, chosen from the group comprising $O_2$ plasma, $H_2O$, $O_3$ and $H_2O_2$.

* * * * *